United States Patent
Nam

(10) Patent No.: US 7,627,297 B2
(45) Date of Patent: Dec. 1, 2009

(54) MULTI-TUNER SYSTEM, SINGLE PACKAGE DUAL TUNING SYSTEM AND RECEIVER AND DIGITAL TELEVISION USING THE SAME

(75) Inventor: Chang Kap Nam, Kyungki-do (KR)

(73) Assignee: Samsung Electro-Mechanics Co., Ltd., Suwon, Kyungki-Do (KR)

(*) Notice: Subject to any disclaimer, the term of this patent is extended or adjusted under 35 U.S.C. 154(b) by 462 days.

(21) Appl. No.: 11/537,099

(22) Filed: Sep. 29, 2006

(65) Prior Publication Data
US 2007/0082637 A1 Apr. 12, 2007

(30) Foreign Application Priority Data
Oct. 11, 2005 (KR) ............... 10-2005-0095751
Jun. 27, 2006 (KR) ............... 10-2006-0058204

(51) Int. Cl.
*H04B 1/10* (2006.01)
(52) U.S. Cl. .............. 455/189.1; 455/300; 455/132
(58) Field of Classification Search ......... 455/132, 455/136, 137, 139, 254, 255, 323, 324, 334, 455/179.1, 180.1, 180.2, 187.1, 189.1, 296, 455/300, 301, 347; 375/345
See application file for complete search history.

(56) References Cited
U.S. PATENT DOCUMENTS
6,072,994 A * 6/2000 Phillips et al. ............. 455/84
2004/0248532 A1 12/2004 Khoini-Poorfard
2005/0253663 A1 11/2005 Gomez et al.
2006/0068708 A1 * 3/2006 Dessert et al. ............ 455/63.1
2006/0276149 A1 * 12/2006 Womac et al. ............ 455/133
2006/0277578 A1 * 12/2006 Goldblatt et al. .......... 725/68

FOREIGN PATENT DOCUMENTS

| | | |
|---|---|---|
| EP | 1317073 A1 | 4/2003 |
| GB | 2410634 A | 8/2005 |
| GB | 2414351 A | 11/2005 |
| GB | 2422260 A | 7/2006 |
| GB | 2423206 A | 8/2006 |
| WO | 98/32233 A3 | 7/1998 |

OTHER PUBLICATIONS

UK Patent Office Search Report mailed Feb. 2, 2007.

* cited by examiner

*Primary Examiner*—Blane J Jackson
(74) *Attorney, Agent, or Firm*—Lowe Hauptman Ham & Berner

(57) ABSTRACT

A multi-tuner system includes a first conversion tuner that converts a first RF signal among a plurality of RF signals received from an antenna into a first IF signal using a first conversion mode, the first RF signal corresponding to a first selected channel; and a second conversion tuner that converts a second RF signal among the RF signals into a second IF signal using a second conversion mode, the second RF signal corresponding to a second selected channel. Any IF interference between the tuners is eliminated, and the tuners can be fabricated into a single module.

18 Claims, 4 Drawing Sheets

MULTI-TUNER SYSTEM, SINGLE PACKAGE DUAL TUNING SYSTEM AND RECEIVER AND DIGITAL TELEVISION USING THE SAME

RELATED APPLICATIONS

This application claims the benefit of Korean Patent Application No. 2005-95751 filed on Oct. 11, 2005, and Korean Patent Application No. 2006-58204 filed on Jun. 27, 2006 in the Korean Intellectual Property Office, the disclosures of which are incorporated herein by reference.

BACKGROUND

1. Technical Field

The disclosed embodiments relate to a multi-tuner system, and a receiver and a TV using the same. The disclosed embodiments have numerous applications, including but not limited to single package dual tuning systems for use in digital TVs with Digital Video Broadcast Terrestrial (DVB-T) receivers.

2. Related Art

Recently, signal processing has been required to be digitalized in a digital TV set or a set-top box for a digital TV according to the European Digital Video Broadcast Terrestrial (DVB-T) standards. It is desired to mount two or three tuners in each TV set or set-top box in order to use one of the tuners for TV receiving and the other for recording.

FIG. 1 is a conceptual view illustrating a conventional dual tuning system for a digital TV.

The conventional tuning system for a digital TV includes a first single conversion tuner 10 for converting a first Radio Frequency (RF) signal corresponding to a first selected channel into a first Intermediate Frequency (IF) signal, and a second single conversion tuner 20 for converting a second RF signal corresponding to a second selected channel into a second IF signal.

However, the conventional dual tuning system of FIG. 1, cannot function properly if IF interference on the same frequency or adjacent frequencies occurs between two tuners (e.g., a main tuner 10 and a sub-tuner 20) which use the same conversion mode. This causes a drawback in that the two tuners 10 and 20 cannot be installed in a single package. As can be seen in FIG. 1, the tuners of the conventional dual tuning system must be fabricated as two separate modules.

For example, in a DVB-T receiver having 36 MHz IF, when the first and second single conversion tuners 10 and 20 are tuned to select the same channel, e.g., 800 MHz RF, the oscillation frequencies of both the first and second conversion tuners 10 and 20 are 836 MHz. That is, the first and second single conversion tuners 10 and 20 have the same IF, which causes IF interference to occur.

Further, when the first and second single conversion tuners 10 and 20 are tuned to select adjacent channels, e.g., when the first single conversion tuner 10 selects 800 MHz RF with its oscillation frequency being tuned to 836 MHz, and the second conversion tuner 20 selects 808 MHz RF with its oscillation frequency being tuned to 844 MHz, the IF of the first single conversion tuner 10 (i.e., 836 MHz) is in such close proximity to the IF of the second single conversion tuner 20 (i.e.; 844 MHz) that IF interference is caused to occur.

In order to avoid such IF interference, the first and second single conversion tuners 10 and 20 can not be embodied in one package, and must be installed in their own packages separate from each other. Thus, two separate tuner packages need to be installed in each TV-set or receiver, resulting in a bulky structure.

There is a need for a multi-tuner system that can avoid or at least mitigate the above drawback of the conventional device.

SUMMARY OF THE INVENTION

In an aspect, a single package multi-tuner system, comprises a single module comprising therein a first conversion tuner for converting a first Radio Frequency (RF) signal among a plurality of RF signals received from an antenna into a first Intermediate Frequency (IF) signal using a first conversion mode, the first RF signal corresponding to a first selected channel; and a second conversion tuner for converting a second RF signal among the RF signals received from the antenna into a second IF signal using a second conversion mode, the second RF signal corresponding to a second selected channel.

In a further aspect, a multi-tuner system comprises a first conversion tuner for converting a first Radio Frequency (RF) signal among a plurality of RF signals received from an antenna into a first Intermediate Frequency (IF) signal using a first conversion mode, the first RF signal corresponding to a first selected channel; and a second conversion tuner for converting a second RF signal among the RF signals received from the antenna into a second IF signal using a second conversion mode, the second RF signal corresponding to a second selected channel. An IF frequency or frequencies of the first conversion tuner is/are different from an IF frequency or frequencies of the second conversion tuner so as to avoid IF interference between the first and second conversion tuners.

In another aspect, a receiver and a digital TV comprising the above-described multi-tuner systems are provided.

BRIEF DESCRIPTION OF THE DRAWINGS

The above and other objects, features and other advantages of the disclosed embodiments of the present invention will be more clearly understood from the following detailed description taken in conjunction with the accompanying drawings, in which.

DETAILED DESCRIPTION OF THE PREFERRED EMBODIMENT

The disclosed embodiments of the present invention will now be described more fully hereinafter with reference to the accompanying drawings. In the accompanying drawings, the like reference signs will be used to designate the like components throughout.

Figure 1:
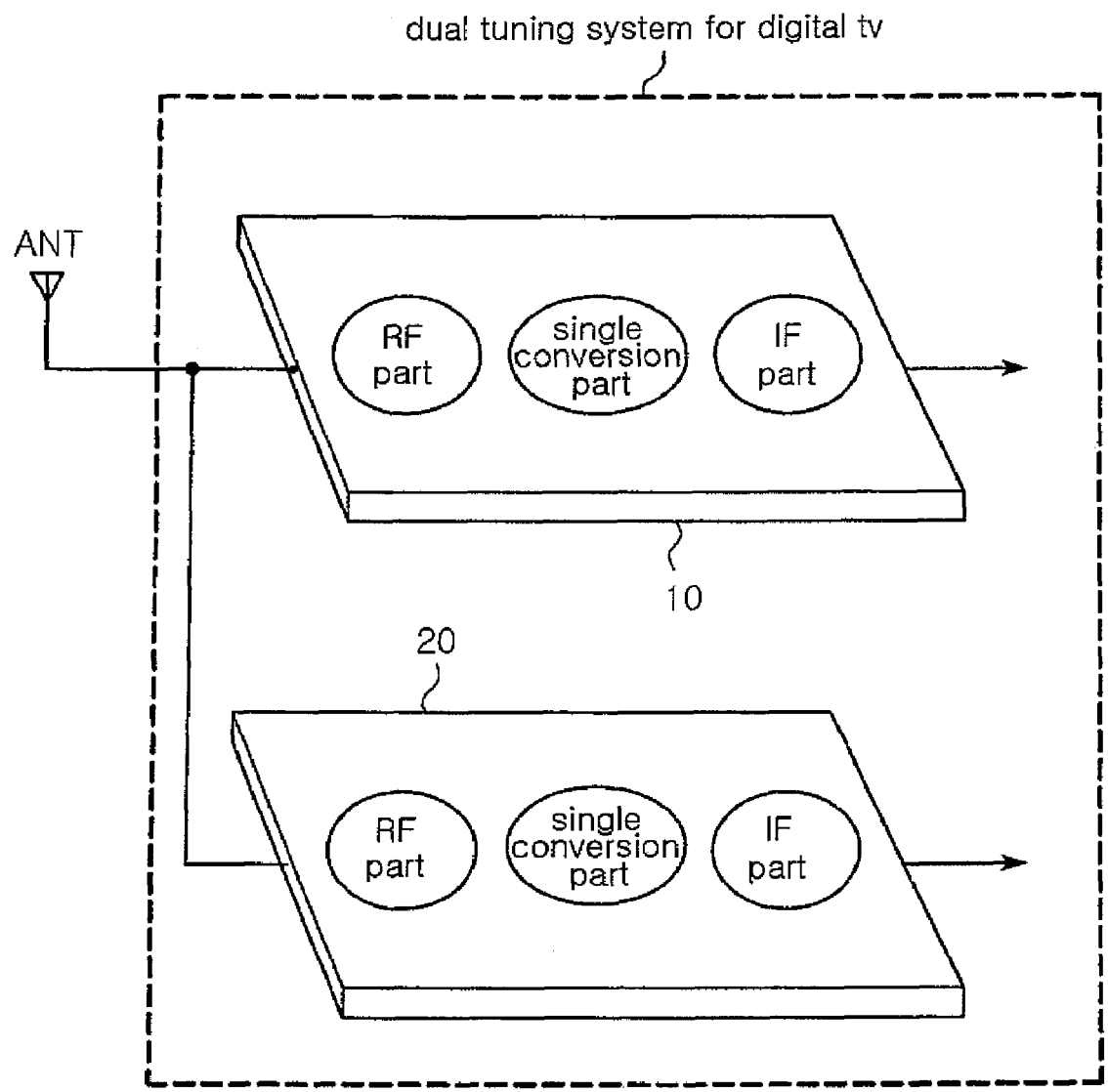
FIG. 1 is a conceptual view illustrating a conventional dual tuning system for a digital TV.
Figure 2:
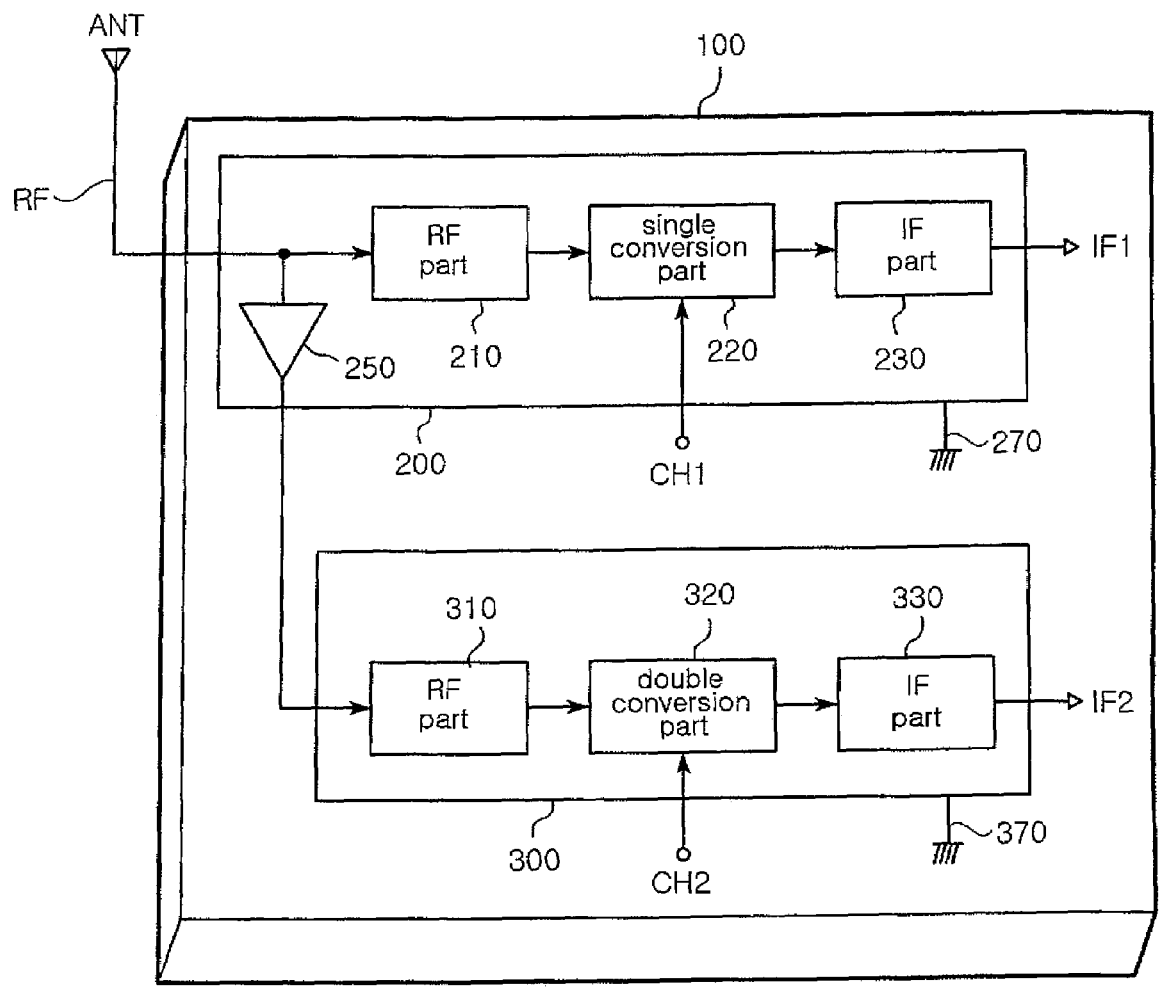
FIG. 2 is a block diagram illustrating a single package dual tuning system according to an embodiment of the invention.

FIG. 2 is a block diagram illustrating a single package dual tuning system according to an embodiment of the invention. The disclosed single package dual tuning system can be used for a digital TV, but the present invention is not limited thereto.

Referring to FIG. 2, a single package dual tuning system 100 includes a first conversion tuner 200 and a second conversion tuner 300. The first conversion tuner 200 operates in a first conversion mode to convert a first RF signal out of RF signals received from an antenna ANT, corresponding to a first selected channel CH1, into a first IF signal IF1. The second conversion tuner 300 operates in a second conversion mode to convert a second RF signal out of the RF signals received from the antenna ANT, corresponding to a second selected channel CH2, into a second IF signal IF2.

In the single package dual tuning system 100, the first and second conversion tuners 200 and 300 are fabricated into a single module or package.

In an aspect, the first conversion tuner 200 includes a ground part, schematically designated at 270 in FIG. 2, separated from a ground part 370 of a Printed Circuit Board (PCB) of the second conversion tuner 300. The ground parts 270, 370 separated from each other prevent or at least minimize interference between the first and second tuners.

For example, the ground part of the first conversion tuner 200 may be of a ground surface formed on a second PCB layer and the ground part of the second conversion tuner 300 may be a ground-surface formed on a fourth PCB layer.

In a further aspect, the first conversion tuner 200 and the second conversion tuner 300 can be any type of tuner, including but not limited to single conversion tuner, multiple conversion tuner and direct conversion tuner, provided that the IF frequencies of the first conversion tuner 200 and the second conversion tuner 300 are sufficiently different so as to avoid or at least minimize IF interference. Such a requirement for different IF frequencies can be met if a first conversion mode of the first conversion tuner 200 is different from a second conversion mode of the second conversion tuner 300, although other arrangements are not excluded. In the exemplary configuration of FIG. 2, the first conversion mode of the first conversion tuner 200 may be realized as a single conversion mode, and the second conversion mode of the second conversion tuner 300 may be realized as a double or direct conversion mode.

The first conversion tuner 200 includes a first RF part 210, a single conversion part 220, and a first IF part 230. The first RF part 210 is operable for filtering and amplifying the RF signals from the antenna ANT. The single conversion part 220 is operable for converting the first RF signal, which is among the RF signals filtered and amplified by the first RF part 210 and corresponds to the first selected channel CH1, into the first IF signal IF1 in the single conversion mode. The first IF part 230 is operable for amplifying and filtering the first IF signal IF1 from the single conversion part 220.

The first conversion tuner 200 further includes a loop through circuit 250 for providing the RF signals from the antenna ANT to the second conversion tuner 300. The loop through circuit 250 can also be configured as part of the second conversion tuner 300 or omitted. If equipped, the loop through circuit 250 may be embodied as a buffer for providing the RF signals from the antenna ANT to the second conversion tuner 300 but preventing any signal of the conversion tuner 300 from propagating to the first conversion tuner 200.

The second conversion tuner 300 includes a second RF part 310, a double Conversion part 320, and a second IF part 330. The second RF part 310 is operable for filtering and amplifying the RF signals from the antenna ANT. The double conversion part 320 is operable for converting the second RF signal, which is among the RF signals filtered and amplified by the second RF part 310 and corresponds to the second selected channel CH2, into the second IF signal IF2. The second IF part 330 is operable for amplifying and filtering the second IF signal IF2 received from the double conversion part 320.

Figure 3:
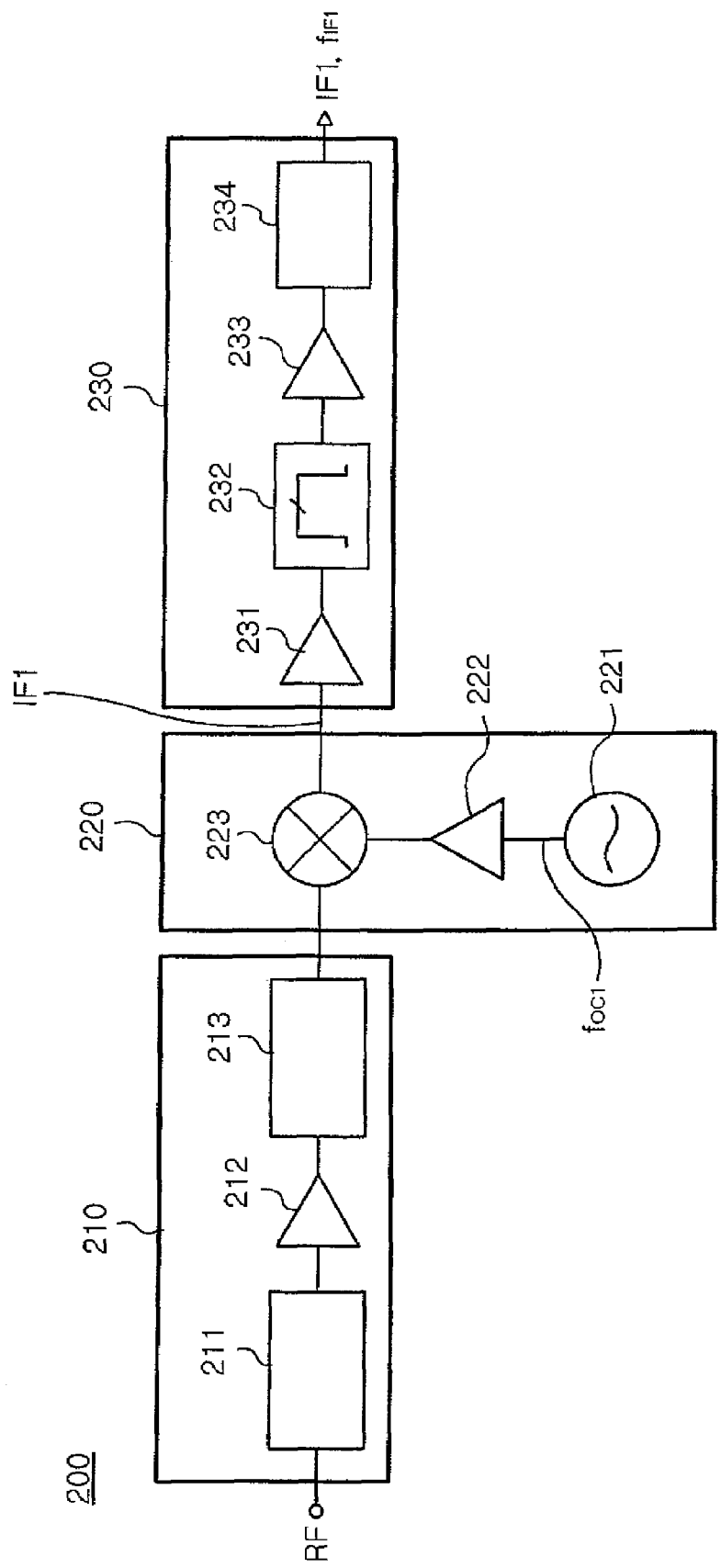
FIG. 3 is a circuit diagram illustrating a first conversion tuner shown in FIG. 2.

FIG. 3 is a circuit diagram illustrating an exemplary configuration of the first conversion tuner 200 shown in FIG. 2. Other configurations are not excluded.

Referring to FIG. 3, the first RF part 210 includes a first RF filter 211, an RF amplifier 212, and a second RF filter 213. The first RF filter 211 is operable for filtering the RF signals received from the antenna ANT and allowing the RF signals within a TV band to pass. The RF amplifier 212 is operable for amplifying the RF signals received from the first RF filter 211 at a predetermined gain. The a second RF filter 213 is operable for filtering the RF signals received from the RF amplifier 212 and allowing the RF signals within a TV band to pass.

The single conversion part 220 includes a local oscillator 221, a buffer 222, and a mixer 223. The local oscillator 221 is operable for generating a local oscillator signal at an oscillation frequency $f_{OC1}$ corresponding to the first selected channel CH1. The buffer 222 is operable for forwarding the local oscillator signal received from the local oscillator 221. The mixer 223 is operable for mixing the local oscillator signal forwarded from the buffer 222 with the RF signals received from the first RF part 210 to output a first IF signal IF1.

The IF part 230 includes a first IF amplifier 231, a first IF filter 232, a second IF amplifier 233, and a second IF filter 234. The first IF amplifier 231 is operable for amplifying the first IF signal IF1 received from the single conversion part 220 at a predetermined gain. The first IF filter 232 is operable for filtering the amplified IF signal received from the first IF amplifier 231 and allowing the IF signal within a preset IF band to pass. The second IF amplifier 233 is operable for amplifying the IF signal received from the first IF filter 232 at a preset gain. The second IF filter 234 is operable for filtering the amplified IF signal received from the second IF amplifier 233 and allowing the IF signal within a preset IF band to pass, thereby outputting the first IF signal IF1.

Figure 4:
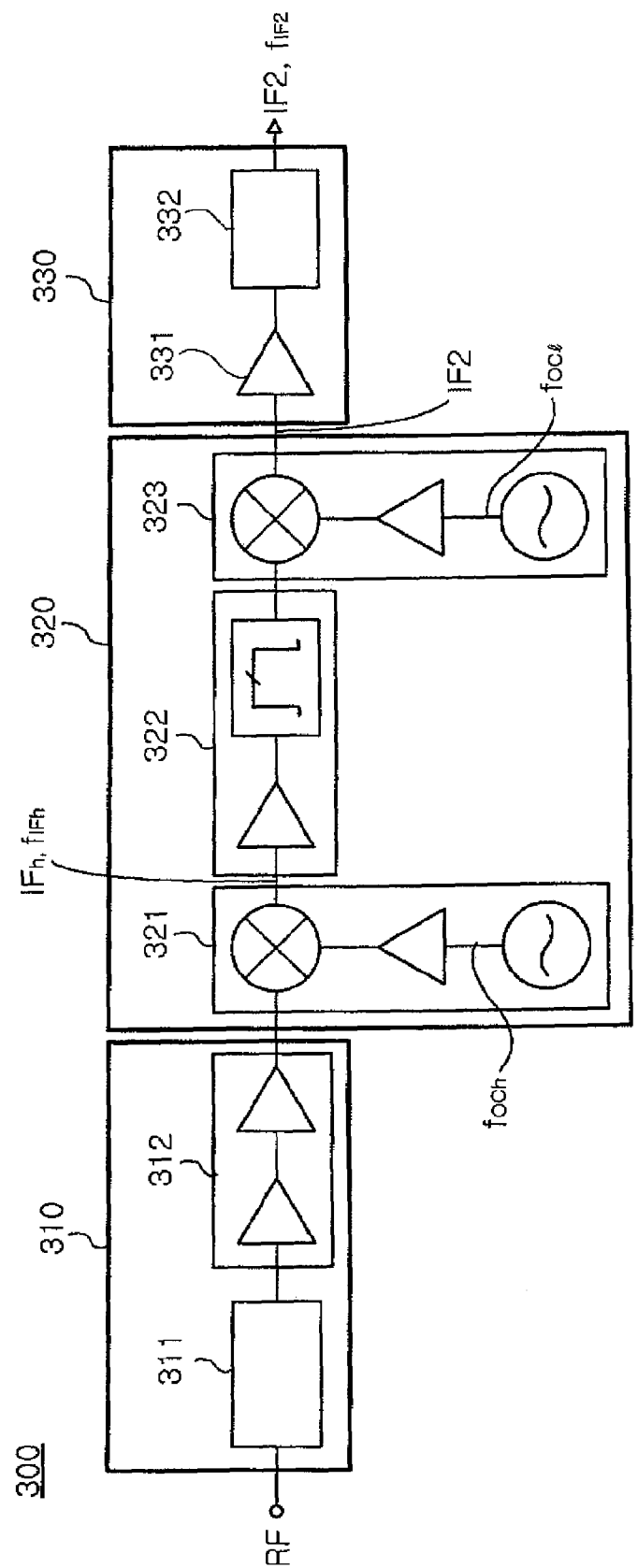
FIG. 4 is a circuit diagram illustrating a second conversion tuner shown in FIG. 2.

FIG. 4 is a circuit diagram illustrating an exemplary configuration of a second conversion tuner shown in FIG. 2. Other configurations are not excluded.

Referring to FIG. 4, the second RF part 310 includes an RF filter 311 and an RF amplifier 312. The RF filter 311 is operable for filtering the RF signals received from the antenna ANT and allowing the RF signals within a TV band to pass. The RF amplifier 312 is operable for amplifying the filtered RF signals received from the RF filter 311 at a preset gain.

The double conversion part 320 includes an up-converter 321, an amplification filter 322, and a down-converter 323. The up-converter 321 is operable for up-converting the second RF signal, which is among the RF signals received from the second RF part 310 and corresponds to the second selected channel CH2, into a high IF signal $IF_h$. The amplification filter 322 is operable for amplifying and filtering the high IF signal $IF_h$ received from the up-converter 321. The down-converter 323 is operable for down-converting the high IF signal $IF_h$ received from the amplification filter 322 to a low or second IF signal IF2.

The second IF part 330 includes an IF amplifier 331 and an IF filter 332. The IF amplifier 331 is operable for amplifying the second IF signal IF2 received from the double conversion part 320 at a preset gain. The IF filter 332 is operable for filtering the amplified second IF signal received from the IF amplifier 331 and allowing the IF signal within a preset IF band to pass, thereby outputting the second IF signal IF2.

The operations and effects of the embodiment of FIGS. 2-4 will now be described.

First referring to FIG. 2, the first conversion tuner 200, upon receiving RF signals from the antenna ANT, converts a first RF signal corresponding to a first selected channel CH1 to a first IF signal IF1 in a first conversion mode. The second conversion tuner 300, upon receiving the RF signals from the antennal ANT, converts a second RF signal corresponding to a second selected channel CH2 to a second IF signal IF2 in a second conversion mode different from the first conversion mode.

Here, the frequency of the first IF signal IF1 of the first tuner 100 can be set to be different from that of the second IF signal IF2 of the second tuner 200. For example, when the frequency of the first IF signal IF1 is set at 36 MHz, the frequency of the second IF signal IF2 may be set at 44 MHz.

For instance, the first selected channel CH1 is one of digital terrestrial broadcast channels in the DVB-T mode of the digital terrestrial TV broadcasting standard, and the second selected channel CH2 is one of the digital terrestrial broadcast channels. Here, the first and second selected channels CH1 and CH2 may be the same channel or different channels.

As disclosed in the foregoing sections, the single package dual tuning system in accordance with embodiments of the invention can be used for a digital TV has and comprises two tuners in a single package. That is, the first conversion tuner 200 and the second conversion tuner 300 are arranged in the single package. Several measures may be adopted to eliminate signal interferences between the first and second conversion tuners 200 and 300. One measure is to adopt different conversion modes in the tuners so that the tuners have different intermediate (IF) frequencies. Another measure is to make ground parts of the tuners physically separated from each other, thereby physically intercepting interference signals through the ground parts.

By adopting any or both of such measures, the single package dual tuning system in accordance with embodiments of the invention can embody multiple, e.g., two, tuners in one package, thereby realizing a dual tuning system of small size, low cost and simple structure.

The first conversion tuner 200 operates in the single conversion mode as follows.

The first RF part 210 of the first conversion tuner 200 provides RF signals from the antennal ANT to the single conversion part 220, after filtering and amplifying the RF signals. The single conversion part 220 converts a first RF signal, which is among the RF signals received from the first RF part 210 and corresponds to the first selected channel CH1, into a first IF signal in the single conversion mode, and provides the first IF signal to the first IF part 230, which amplifies and filters the first IF signal received from the single conversion part 220.

If equipped with the loop through circuit 250, the first conversion tuner 200 also provides the RF signals from the antenna ANT to the second conversion tuner 300 via the loop through circuit 250.

The second conversion tuner 300 operates in the double conversion mode as follows.

The second RF part 310 of the second conversion tuner 300 outputs RF signals from the antenna ANT to the double conversion part 320, after filtering and amplifying the RF signals. The double conversion part 320 converts a second RF signal, which is among the RF signals received from the second RF part 310 and corresponds to the second selected channel CH2, into a second IF signal in the double conversion mode, and outputs the second IF signal to the second IF part 330. The second IF part 330 amplifies and filters the second IF signal received from the double conversion part 320.

The operation of the first conversion tuner 200 will now be described in detail with reference to FIG. 3.

Referring to FIG. 3, the first filter 211 of the first RF part 210 allows a TV band of RF signals received from the antenna ANT to pass to the RF amplifier 212. The RF amplifier 212 amplifies the RF signals received from the first RF filter 211 at a predetermined gain and outputs the amplified RF signals to the second RF filter 213. The second RF filter 213 allows a TV band of the RF signals received from the RF amplifier 212 to pass to the single conversion part 220.

The local oscillator 221 of the single conversion part 220 generates a local oscillator signal at an oscillation frequency $f_{OC1}$ corresponding to the first selected channel CH1, and the buffer 222 forwards the local oscillator signal of the oscillation frequency foci from the local oscillator 221 to the mixer 223. Then, the mixer 223 mixes the local oscillator signal of the oscillation frequency $f_{OC1}$ forwarded from the buffer 222 with the RF signals received from the first RF part 210 to generate a first IF signal IF1, and provides the IF signal IF1 to the first IF part 230.

The first IF amplifier 231 of the IF part 230 amplifies the first IF signal IF1 received from the single conversion part 220 at a predetermined gain, and outputs the amplified IF signal to the first IF filter 232. The first IF filter 232 allows a preset IF band of the IF signal received from the first IF amplifier 231 to pass to the second IF amplifier 233. The second IF amplifier 233 amplifies the IF signal from the first IF filter 232 at a preset gain, and outputs the amplified IF signal to the second IF filter 234. Then, the second IF filter 234 allows a preset IF band of the IF signal received from the second IF amplifier 233 to pass, thereby outputting the first IF signal IF1.

The operation of the second conversion tuner 300 will now be described in detail with reference to FIG. 4.

Referring to FIG. 4, the RF filter 311 of the second RF part 310 allows a TV band of the input RF signals to pass to the RF amplifier 312. The RF amplifier 312 amplifies the RF signals received from the RF filter 311 at a preset gain, and outputs the amplified RF signals to the double conversion part 320.

The up-converter 321 of the double conversion part 320 up-converts the second RF signal, which is among the RF signals received from the second RF part 310 and corresponds to the second selected channel CH2, into a high IF signal $IF_h$, and outputs the up-converted high IF signal $IF_h$ to the amplification filter 322. The amplification filter 322 amplifies and filters the high IF signal $IF_h$ received from the up-converter 321, and outputs the amplified/filtered high IF signal $IF_h$ to the down-converter 323. Then, the down-converter 323 down-converts the high IF signal $IF_h$ received from the amplification filter 322 to a second or low IF signal IF2, and outputs the second IF signal IF2 to the second IF part 330.

In the second IF part 330, the IF amplifier 331 amplifies the second IF signal IF2 received from the double conversion part 320 at a preset gain, and the IF filter 332 allows a preset IF band of the second IF signal received from the IF amplifier 331 to pass, thereby outputting the second IF signal IF2.

An explanation will be made of, for example, a DVB-T terminal having 36 MHz IF where the first and second conversion tuners 200 and 300 are tuned to select the same channel. When both the first and second conversion tuners 200 and 300 select the same RF channel of, e.g., 800 MHz, the oscillation frequency $f_{OC1}$ of the first conversion tuner 200 is tuned to 836 MHz, and the high oscillation frequency $f_{OCh}$ of the up-converter 321 of the second conversion tuner 300 is tuned to 2,000 MHz. The frequency $f_{OC1}$ of the high IF signal $IF_h$ is relatively constant, e.g., fixed at 1200 MHz. Similarly, the low oscillation frequency $f_{OC1}$ of the down-converter 323 of the second conversion tuner 300 is relatively constant, e.g., fixed at 1,244 MHz. The frequencies $f_{IF1}$ and $f_{IF2}$ of the first and second IF signals IF1 and IF2, respectively, are set (or fixed) at 36 and 44 MHz, respectively. The fixed or constant frequencies $f_{IFh}$ (1200 MHz), $f_{OC1}$ (1244 Mhz), $f_{IF1}$ (36

MHz) and $f_{IF2}$ (44 MHz) are different one from another, and different from the variable oscillation frequencies $f_{OC1}$ (836 MHz) and $f_{OCh}$ (2000 MHz) to avoid any IF interference. IF interference between the variable oscillation frequencies $f_{OC1}$ (836 MHz) and $f_{OCh}$ (2000 MHz) of the first and second conversion tuners 200 and 300, respectively, is avoided, because they are not the same and not located in sufficiently close proximity. In an arrangement, the tunable range of the first conversion tuner 200, i.e., $f_{OC1}$, is chosen to be outside the tunable range of the up-converter 321 of the second conversion tuner 300, i.e., $f_{OCh}$, so that the variable frequencies $f_{OC1}$ and $f_{OCh}$ never coincide or are in close proximity.

Another explanation will be made of, for example, a case where the first and second conversion tuners 200 and 300 are tuned to select adjacent channels, e.g., 800 and 808 MHz, respectively. As the first single conversion tuner 200 selects, e.g., 800 MHz RF, the oscillation frequency $f_{OC1}$, of the first conversion tuner 200 is tuned to 836 MHz, and as the second conversion tuner 300 selects 808 MHz RF, the high oscillation frequency $f_{OCh}$ of the up-converter 321 of the second conversion tuner 300 is tuned to 2,008 MHz. The frequency $f_{IFh}$ of the high IF signal IF$_h$ is fixed at 1200 MHz, and the low oscillation frequency $f_{OC1}$, of the down-converter 323 of the second conversion tuner 300 is fixed at 1,244 MHz. Likewise, the frequencies $f_{IF1}$ and $f_{IF2}$ of the first and second IF signals IF1 and IF2, respectively, are set (or fixed) at 36 and 44 MHz, respectively. The fixed or constant frequencies $f_{IFh}$ (1200 MHz), $f_{OC1}$ (1244 Mhz), $f_{IF1}$ (36 MHz) and $f_{IF2}$ (44 MHz) are chosen to be different one from another, and different from the variable oscillation frequencies $f_{OC1}$ (836 MHz) and $f_{OCh}$ (2008 MHz) to avoid any IF interference. IF interference between the variable oscillation frequencies $f_{OC1}$ (836 MHz) and $f_{OCh}$ (2008 MHz) of the first and second conversion tuners 200 and 300, respectively, is avoided, because they are not the same and not located in sufficiently close proximity.

The present invention is not limited to the embodiments disclosed above. For example, in an arrangement, the fixed or constant frequencies $f_{IFh}$, $f_{OC1}$, $f_{IF1}$ and $f_{IF2}$ are chosen to be not only different one from another but also outside the tunable frequency ranges of the first and second conversion tuners 200 and 300, e.g., outside the tunable frequency range ($f_{OC1}$) of the local oscillator 221 and outside the tunable frequency range ($f_{OCh}$) of the up-converter 321. In a further arrangement, the tunable frequency ranges of the first and second conversion tuners 200 and 300 are chosen so as they do not overlap, e.g., the tunable frequency range ($f_{OC1}$) of the local oscillator 221 is outside the tunable frequency range ($f_{OCh}$) of the up-converter 321, so that there will be no IF interference no matter what channels the tuners 200 and 300 are tuned to. Embodiments of the present invention are applicable not only to dual tuning systems, but also to other, multi-tuner systems with more than two tuners. Likewise, embodiments of the present invention are usable not only in digital TVs using the DVB-T standard, but also in any type of TV (e.g., analog or digital) or receiving equipment (e.g., receiver, analog/digital video recorder etc.) using any available standard.

As set forth hereinbefore, the single package dual tuning system in accordance with the disclosed embodiments, e.g., for use in a digital TV with a DVB-T receiver, has at least two tuners, such as a single conversion tuner and a double conversion tuner, wherein the tuners have intermediate frequencies set to be different from each other to eliminate any IF interference between the tuners, and thus the tuners can be fabricated into a single package. As a result, a single package tuner structure can be adopted in place of the conventional structure of two separate tuners.

Additionally or alternatively, the tuners have their ground parts physically separated from each other, thereby ensuring maximum IF isolation between the tuners. Furthermore, it is possible to record data on a digital storage device with one tuner while receiving data with the other tuner. Additional advantages and modifications could be made herein without departing from the scope of the present invention as defined by the appended claims.

What is claimed is:

1. A single package multi-tuner system, comprising a single module comprising therein:
    a first conversion tuner configured to convert a first Radio Frequency (RF) signal among a plurality of RF signals received from an antenna into a first Intermediate Frequency (IF) signal using a first conversion mode, the first RF signal corresponding to a first selected channel; and
    a second conversion tuner configured to convert a second RF signal among the RF signals received from the antenna into a second IF signal using a second conversion mode, the second RF signal corresponding to a second selected channel;
    wherein the first conversion tuner includes a ground part physically and electrically separated from a ground part of the second conversion tuner, the separated ground parts configured to prevent interference between the first and second tuners.

2. The system of claim 1, wherein the first conversion mode of the first conversion tuner is different from the second conversion mode of the second conversion tuner.

3. The system of claim 1, wherein the first conversion tuner is a single conversion tuner and includes:
    a first RF part configured to filter and amplify the RF signals from the antenna;
    a single conversion part configured to convert the first RF signal among the RF signals received from the first RF part into the first IF signal; and
    a first IF part configured to amplify and filter the first IF signal received from the single conversion part.

4. The system of claim 3, wherein the first conversion tuner further includes a loop through circuit configured to provide the RF signals from the antenna to the second conversion tuner.

5. The system of claim 3, wherein the second conversion tuner is a double conversion tuner and includes:
    a second RF part configured to filter and amplify the RF signals from the antenna;
    a double conversion part configured to convert the second RF signal among the RF signals received from the second RF part into the second IF signal; and
    a second IF part configured to amplify and filter the second IF signal received from the double conversion part.

6. The system of claim 5, wherein the double conversion part includes:
    an up-converter configured to up-convert the second RF signal among the RF signals received from the second RF part into a high IF signal;
    an amplification filter configured to amplify and filter the high IF signal received from the up-converter; and
    a down-converter configured to down-convert the high IF signal received from the amplification filter into the second IF signal.

7. The system of claim 1, wherein the first conversion mode of the first conversion tuner is different from the second conversion mode of the second conversion tuner.

8. The system of claim 7, wherein the first conversion mode of the first conversion tuner is a single conversion mode, and the second conversion mode of the second conversion tuner is a double or direct conversion mode.

9. The system of claim 1, wherein an IF frequency of the first IF signal output by the first conversion tuner is set to be different from an IF frequency of the second IF signal output by the second conversion tuner.

10. A multi-tuner system, comprising:
a first conversion tuner configured to convert a first Radio Frequency (RF) signal among a plurality of RF signals received from an antenna into a first Intermediate Frequency (IF) signal using a first conversion mode, the first RF signal corresponding to a first selected channel; and
a second conversion tuner configured to convert a second RF signal among the RF signals received from the antenna into a second IF signal using a second conversion mode, the second RF signal corresponding to a second selected channel;
wherein an IF frequency or frequencies of the first conversion tuner is/are different from an IF frequency or frequencies of the second conversion tuner so as to avoid IF interference between the first and second conversion tuners;
wherein the first conversion tuner includes a ground part physically and electrically separated from a ground part of the second conversion tuner, the physically and electrically separated ground parts configured to prevent interference between the first and second tuners.

11. The system of claim 10, wherein the first conversion mode of the first conversion tuner is different from the second conversion mode of the second conversion tuner.

12. The system of claim 10, wherein the first conversion tuner is a single conversion tuner and the second conversion tuner is a double or direct conversion tuner.

13. The system of claim 10, wherein each IF frequency of the first conversion tuner is different from the IF frequency or frequencies of the second conversion tuner.

14. The system of claim 10, wherein
fixed IF frequencies of the tuners are different one from another and are located outside tunable ranges of variable IF frequencies of the tuners; and
said tunable ranges do not overlap.

15. A receiver, comprising a single package multi-tuner system as set forth in claim 1.

16. A receiver, comprising a multi-tuner system as set forth in claim 10.

17. A digital TV, comprising a DVB-T receiver which comprises a single package multi-tuner system as set forth in claim 1.

18. A digital TV, comprising a DVB-T receiver which comprises a multi-tuner system as set forth in claim 10.

* * * * *